United States Patent
Seidl et al.

(10) Patent No.: US 6,949,269 B2
(45) Date of Patent: Sep. 27, 2005

(54) METHOD FOR PRODUCING VERTICAL PATTERNED LAYERS MADE OF SILICON DIOXIDE

(75) Inventors: Harald Seidl, Feldkirchen (DE); Martin Gutsche, Dorfen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/690,002

(22) Filed: Oct. 21, 2003

(65) Prior Publication Data

US 2004/0146655 A1 Jul. 29, 2004

(30) Foreign Application Priority Data

Oct. 21, 2002 (DE) .......................... 102 48 980

(51) Int. Cl.[7] ................................ B05D 1/36
(52) U.S. Cl. .................. 427/261; 427/230; 427/235; 427/236; 427/256; 427/258; 427/264; 427/271; 427/277; 427/299; 427/300; 427/301; 427/304; 427/305; 427/355; 427/407.1; 427/407.2; 427/419.1; 427/419.2; 427/419.3; 427/419.8
(58) Field of Search ................. 427/230, 235, 427/236, 256, 258, 261, 264, 271, 277, 299–301, 304, 355, 407.1, 407.2, 419.1–419.3, 419.8

(56) References Cited

U.S. PATENT DOCUMENTS

2004/0043149 A1 * 3/2004 Gordon et al. ......... 427/255.31

FOREIGN PATENT DOCUMENTS

| EP | 0 223 987 A2 | 6/1987 |
| WO | 02/27063 A2 | 4/2002 |

OTHER PUBLICATIONS

K.A. Miller et al.: "Self–limiting chemical vapor deposition of an ultra–thin silicon oxide film using tri–(tert–butoxy)silanol", *Thin Solid Films*, vol. 397, 2001, pp. 78–82.

Dennis Hausmann et al.: "Rapid Vapor Deposition of Highly Conformal Silica Nanolaminates", *Science*, vol. 298, Oct. 11, 2002, pp. 402–406.

* cited by examiner

*Primary Examiner*—Jennifer Michener
(74) *Attorney, Agent, or Firm*—Laurence A. Greenberg; Werner H. Stemer; Ralph E. Locher (57) ABSTRACT

A method is taught for fabricating patterned silicon dioxide layers on process areas disposed perpendicularly or at an inclination to a substrate surface. Firstly, a starter layer having leaving groups is produced by non-conformal deposition of a reactive component. Tris(tert-butoxy)silanol is subsequently added. The addition of the tris(tert-butoxy) silanol leads to the formation of a silicon dioxide layer selectively only on the starter layer.

21 Claims, 7 Drawing Sheets

METHOD FOR PRODUCING VERTICAL PATTERNED LAYERS MADE OF SILICON DIOXIDE

BACKGROUND OF THE INVENTION

Field of the Invention

The invention relates to a method for fabricating patterned layers made of silicon dioxide on process areas disposed perpendicularly or at an inclination to a substrate surface.

In semiconductor process technology, planar process areas disposed horizontally with respect to a substrate surface are patterned by photolithographic methods in conjunction with selective etching techniques. During the processing of integrated circuits, reliefs with a pronounced topography are produced on the substrate surface. Such a relief also has surfaces that are perpendicular or at an inclination to the substrate surface. In the course of further miniaturization (shrinking) of the integrated circuits, the need arises also to pattern vertical or inclined process areas in order to differentiate functionally the structures in their vertical extent. Examples thereof are the deep trench capacitor, the stacked capacitor, and vertical transistor configurations. Patterning reliefs in a direction perpendicular to the substrate surface is not directly possible by using photolithographic methods.

By way of example, if, in the fabrication of a trench capacitor, only sections of the sidewalls of a trench that are disposed perpendicularly to the substrate surface are to be covered with a layer made of silicon dioxide, in order to form a collar at the upper end of the trench, the procedure hitherto has been that the trench is firstly filled with a filling material in the lower region, which is to remain without a covering by the layer made of silicon dioxide. A layer made of silicon dioxide can then be produced on the uncovered sections of the sidewalls of the trench. Afterward, the filling material can be removed in order that the sidewalls are uncovered again in the lower section of the trench.

In detail, the procedure is such that firstly a trench is introduced into the substrate and a dielectric is deposited over the whole area on the sidewalls of the trench. The trench prepared in this way is filled with a filling material, for example polysilicon, and the filling material is subsequently etched back to an extent such that that section of the sidewall on which the layer made of silicon dioxide is to be deposited is uncovered again. A layer made of silicon dioxide is then deposited, for example by using a CVD method (CVD=chemical vapor deposition). The layer made of silicon dioxide is subsequently etched anisotropically in order to remove portions of the layer that are disposed on the filling material, while the layer remains unchanged at the sidewalls of the trench. The remaining space can subsequently be filled with polysilicon, for example, in order to produce an electrical connection between the inner electrode of the trench capacitor and a transistor.

If the intention firstly is to fabricate the collar of the trench capacitor in order, for example, to be able to selectively process the lower sections of the trench, the procedure is such that firstly an etching stop layer, for example a nitride layer, is deposited over the entire area of the relief. The relief is subsequently filled with a suitable filling material, for example with polycrystalline silicon, and the filling material is etched back down to a depth corresponding to the sections of the sidewalls on which the layer made of silicon dioxide is to be deposited. The etching stop layer is then removed in the uncovered sections of the sidewalls and the silicon dioxide is deposited or produced thermally on the uncovered areas. The silicon dioxide is subsequently etched anisotropically in order to remove sections of the silicon dioxide layer that are disposed on the surface of the filling material. In this case, the silicon dioxide remains on the vertical sidewalls. The filling material is removed and, as a final step, the etching stop layer is completely removed.

Plasma enhanced chemical vapor deposition methods (PECVD) are discussed in addition to the above-described methods for fabricating a collar for a trench capacitor. In this case, thin layers are produced on surfaces of a relief; the thickness of these layers, which are on surfaces that are at an inclination or perpendicular to the substrate surface, decreases with increasing depth. In this way, it is thus possible, proceeding from the substrate surface, to cover sections of the sidewalls of a trench with a silicon dioxide layer without covering the lower sections of the trench with a filling material. However, the run-off of the layer produced in the depth can only be controlled with difficulty in these methods. Furthermore, such layers have very great differences in thickness between an end point in the depth of the substrate and a region near the substrate surface.

Equally, during a diffusion-limited deposition of silicon dioxide by using tetraethyl orthosilane (TEOS), the silicon dioxide grows on surfaces that are perpendicular or at an inclination to the substrate surface at a rate that decreases relative to the relief depth. As a result, the layer thickness of the silicon dioxide thus produced decreases in the direction of the relief depth.

The lower termination of the silicon dioxide layer in a trench can be established significantly more accurately if a non-conformal ALD method (ALD=atomic layer deposition) is used for the deposition. In ALD methods, the precursor compounds are deposited in a self-limiting manner. To that end, firstly reactive groups are provided on the substrate surface, with which groups, a first precursor compound can react chemically and is thereby chemisorbed on the substrate surface. Once a monolayer of the first precursor compound has formed, the reaction stops because there are no longer any free reactive groups available on the substrate surface. Once excess first precursor compound has been pumped away, a second precursor compound can then be introduced, which can react with reactive groups provided by the first precursor compound. A second monolayer produced from the second precursor compound thus forms in a self-limiting manner. If the first and second precursor compounds are then introduced alternately, a layer of silicon dioxide can be produced for example from $Si(NCO)_4$ or $CH_3OSi(NCO)_3$ as first precursor compound and $H_2O$ or $O_3$ as second precursor compound, the thickness of the layer being determined very precisely and being constant over its entire extent. If the chemisorption proceeds in a diffusion-controlled manner, for example when producing a layer made of silicon dioxide in trenches having a high aspect ratio, the monolayer grows proceeding from the upper edge of the sidewall of the trench, that is to say the substrate surface, in the direction of the lower end of the trench. If the chemisorption of the precursor compound is terminated before a complete monolayer has formed, the extent of the layer can be restricted to the upper sections of the trench. The advantages of the non-conformal ALD method are opposed by the disadvantage that long process times have to be accepted if layers having a relatively large thickness are to be produced.

R. G. Gordon et al. (MRS Spring Meeting 2002) report on a "catalytic" growth of a silicon dioxide layer, layer thicknesses of up to 120 Å per cycle being achieved. In this case, firstly trimethylaluminum is chemisorbed on a substrate surface. Afterward, tris(tert-butoxy)silanol is added to the substrate surface, a chain growth of a siloxane commencing. Subsequent crosslinking of the siloxane chains results in the formation of a layer made of silicon dioxide.

The previously known methods for fabricating patterned silicon dioxide layers on process areas disposed perpendicularly or at an inclination to a substrate surface thus either encompass a combination of deposition and etching processes. That is, the prior-art methods are very complicated, or they produce layers made of silicon dioxide with a non-uniform thickness whose extent into the depth of a trench can only be determined in an imprecise manner. Although the non-conformal ALD method makes it possible to fabricate uniform silicon dioxide layers whose extent can be controlled in a defined manner, the non-conformal ALD method is very time-consuming to carry out.

SUMMARY OF THE INVENTION

It is accordingly an object of the invention to provide a method for producing vertical patterned layers made of silicon dioxide that overcomes the hereinafore-mentioned disadvantages of the heretofore-known devices of this general type and that makes it possible, in a simple manner and in periods of time suitable for an industrial application, to produce a patterned layer made of silicon dioxide having an substantially uniform layer thickness on process areas that are at an inclination or perpendicular to a substrate surface, the layer, proceeding from the substrate surface, being intended to extend only as far as a predetermined coverage depth.

With the foregoing and other objects in view, there is provided, in accordance with the invention, a method for fabricating patterned silicon dioxide layers on process areas disposed perpendicularly or at an inclination to a horizontal substrate surface. In a first step, a substrate is provided in a process space. The substrate includes a relief with process areas disposed perpendicularly or at an inclination to the substrate surface. Next, a starter layer with leaving groups that can be substituted by hydroxyl groups are produced on sections of the process areas that extend from the substrate surface down to a specific coverage depth of the relief. Next, tris(tert-butoxy)silanol is added to the substrate. A layer of silicon dioxide is grown selectively on the starter layer.

The method according to the invention utilizes the above-described "catalytic" growth of a silicon dioxide layer with the use of tris(tert-butoxy)silanol as reactive compound in order to achieve a sufficient layer thickness growth within periods of time suitable for an industrial application. Furthermore, the extent of the silicon dioxide layer is determined by the fact that a starter layer is provided on the process areas only in the sections in which a layer growth is to take place. The starter layer has groups that can be substituted by the hydroxyl group of tris(tert-butoxy)silanol. If tris(tert-butoxy)silanol is added to the relief, it is therefore bonded only on the sections of the process areas on which leaving groups are provided, whereas the tris(tert-butoxy) sila-nol is not bonded in the other sections. Therefore, it is possible to use the tris(tert-butoxy)silanol in an excess, so that a uniform layer thickness growth takes place on the entire section of the process areas that is defined by the starter layer. The tris(tert-butoxy)silanol is generally fed to the substrate surface as a gas; the concentration of the tris(tert-butoxy)silanol is chosen as far as possible to be high enough that the reaction does not proceed in a diffusion-controlled manner. Because of this, a rapid growth of the siloxane chains is achieved and a silicon dioxide layer that has an substantially uniform layer thickness over its entire extent is obtained. Because the reaction is generally carried out at elevated temperature, the siloxane chains are rapidly crosslinked to form a silicon dioxide layer.

Thus, in contrast to the diffusion-controlled vapor-phase deposition methods, the method according to the invention yields a uniform thickness of the layer over the entire extent of the silicon dioxide layer. Moreover, the method determines the termination of the silicon dioxide layer in a very precise manner by limiting the extent of the starter layer. The method significantly shortens the process times required for fabricating a silicon dioxide layer of a specific thickness compared to the non-conformal ALD method.

The growth of the siloxane chains or the growth of the silicon dioxide layer decreases as the reaction duration advances. It is assumed that the tris(tert-butoxy)silanol molecules firstly have to diffuse through the newly produced layer as far as the starter layer in order then to be incorporated into the siloxane chains. As the layer thickness of the layer produced increases, the duration required by the tris (tert-butoxy)silanol molecules for diffusion increases, so that the reaction is slowed. It is favorable, therefore, to produce a starter layer anew at specific time intervals, i.e. when the growth of the layer has fallen to a specific value. Afterward, the growth of the layer is continued by feeding in tris(tert-butoxy)silanol. Thus, the above-described first step of providing a starter layer and the second step of depositing a silicon dioxide layer from tris(tert-butoxy) silanol are preferably performed successively a number of times one after the other. The above described first and second steps thus in each case produce a cycle. The number of cycles that are performed for fabricating the silicon dioxide layer is determined by the desired thickness of the layer in this case. In this case, the starter layer is preferably embodied such that it has the same extent over all of the cycles, so that the lower termination of the silicon dioxide layer can be clearly delimited.

The starter layer is preferably produced by chemisorption of a reactive component, the quantity of the reactive component that forms the starter layer in the process space being restricted to a quantity less than that required for complete coverage of the process areas.

In this embodiment, the method according to the invention utilizes an effect as is also utilized in the non-conformal ALD method, in order to produce a layer only on sections of a process area. Given a diffusion-controlled reaction implementation, the covering of the process areas with the reactive component takes place beginning at the upper edge of the perpendicular or inclined process areas and continues in the direction of the lower edge of the process area. The covering of the perpendicular or inclined process areas thus begins at the substrate surface and continues in a manner directed into the depth of the relief. Therefore, a complete layer of the reactive component results in the upper regions of the relief facing the substrate surface, while virtually no deposition of the reactive component is effected in lower regions. An intervening transition region, in which a register gradient is present, has only a small extent relative to the typical relief depth. Such a directed systematic covering of a relief from the substrate surface in the direction of the relief depth results if the reactive component has a low desorption coefficient and is offered in a reduced quantity with respect to a quantity required for complete coverage.

If the reactive component has a low desorption coefficient, then the probability of an already adsorbed molecule of the reactive component being removed again from the layer, that is to say desorbed, is very low. If a reactive component having a low desorption coefficient, corresponding to a high sticking coefficient, is provided in the course of producing the starter layer, then a relief provided on a substrate surface is covered progressively from the substrate surface into the depth. Apart from a short transition region, the coverage is effected completely and with a uniform layer thickness in this case.

The reactive component is preferably formed in such a way that it can react with groups, for example hydroxyl groups, provided on the process area. The reactive component can thereby be chemically bonded on the process area, with the result that a monolayer of the chemically bonded reactive component is obtained. In this case, the reactive component is formed in such a way that, after the reaction with groups provided on the process areas, leaving groups are still maintained which can be displaced by the hydroxyl group of the tris(tert-butoxy)silanol. The fabrication of the starter layer thus inherently corresponds to the procedure known from the non-conformal ALD method.

The non-conformal deposition of the starter layer obviates the need to mask sections which are not intended to be covered by the silicon dioxide layer, for example by these regions of the relief being filled with a filling material. The fabrication of the patterned silicon dioxide layer can thereby be simplified to a significant extent.

Given predetermined process parameters, the accuracy with which a predetermined coverage depth can be achieved depends on the total area of the starter layer that is to be covered. The larger the total area to be covered, the less the dependence of the coverage depth on fluctuations in the quantity of reactive component fed or the duration of the deposition of the reactive component. The higher the density of the structures disposed on the substrate surface, the larger the area of the starter layer which is to be covered with the reactive component becomes as well, since the relief is patterned increasingly more finely and more densely in the horizontal extent and increasingly functional structures are realized at vertical surfaces. Thus, the number of trench capacitors per unit area rises in memory chips, for example, as the storage capacity increases. The accuracy with which the lower edge of a collar made of silicon dioxide can be produced thus rises as the density of the trench capacitors disposed per unit area in a memory chip increases.

It is important for carrying out the method according to the invention that the extent of the starter layer from the substrate surface into the depth of the substrate can be restricted to a lower value than the maximum depth of the relief. If the starter layer is produced by non-conformal deposition of the reactive component, the quantity of the reactive component may be restricted by way of the quantity of the reactive component that is fed to the process space.

In this embodiment of the method according to the invention, the quantity of the reactive component that is fed to the process space is thus restricted such that it does not suffice to completely cover the process areas. After the reactive component has been fed into the process space, the vertical or inclined process areas are systematically covered from the substrate surface in the direction of the relief depth, the deposition of the reactive component coming to a standstill as a result of the increasing depletion of the atmosphere in the process space, so that the starter layer covers the perpendicular or inclined process areas only incompletely. After the starter layer has been formed, residues of the reactive component that are still present in the process state can be pumped away or the process space can be flushed with an inert flushing gas. Afterward, as described above, tris(tert-butoxy)silanol is introduced in order to grow a silicon dioxide layer on the starter layer.

The metering of the quantity of the reactive component that is fed to the process space can be controlled very precisely if the quantity of the reactive component that is fed to the process space is metered by liquid injection. The reactive component vaporizes in the process space or an injection chamber upstream of the process space and passes as a gas onto the perpendicular or inclined process areas in order to be chemisorbed there.

In accordance with a further embodiment of the method according to the invention, the quantity of the reactive component is restricted by way of a residence duration of the reactive component in the process space. In this embodiment of the method, the quantity of the reactive component fed to the process space may be chosen to be higher than is necessary for the selective coverage of that section of the process areas which is prescribed by the starter layer. After a specific residence duration, which is chosen in such a way that only an incomplete coverage of the perpendicular or inclined process areas has taken place, excess reactive component is removed from the process space, for example by being pumped away or flushed from the process space using an inert flushing gas. Afterward, tris(tert-butoxy)silanol is once again introduced.

The adaptation of the method according to the invention to different types of reliefs can also be effected by way of the chamber pressure that prevails during the deposition of the reactive component in the process chamber. Thus, a deposition of a non-conformal starter layer on a shallow relief having structures with low aspect ratios and/or a high proportion of process areas that are inclined with respect to the substrate surface requires, for the same coverage depth, a lower chamber pressure than a deposition on a deep relief having structures with a high aspect ratio. The structures preferably have an aspect ratio of greater than thirty (>30).

In order to achieve a uniform coverage depth, i.e. a uniform extent of the silicon dioxide layer, over the entire substrate surface even in the case of substrates having a large diameter, the reactive component is preferably added in a manner distributed uniformly over the substrate surface by using a distribution device provided in the process space.

The reactive component from which the starter layer is produced preferably includes leaving groups, which enables a reaction on the one hand with groups provided on the process are and on the other hand with the hydroxyl group of the tris(tert-butoxy)silanol. Organometallic compounds are preferably used as the reactive component. The ligands of organometallic compounds readily undergo exchange reactions, so that the organometallic compound is bonded to the groups, for example hydroxyl groups, provided on the process area. Since organometallic compounds can generally bond a larger number of ligands, even after the absorption of the organometallic compound on the process area there are still enough ligands available to bond the tris(tert-butoxy)silanol in an exchange reaction. Furthermore, a large number of organometallic compounds are offered commercially, so that they are accessible simply and usually cost-effectively.

The organic ligands bonded to a central metal atom should readily be able to be exchanged in order to enable a rapid reaction of the organometallic compound with groups that are ready on the process area or with the hydroxyl group of the tris(tert-butoxy)silanol. Therefore, the organometallic compound preferably contains a metal selected from the group formed from Al, Hf, Zr, Ti, Y, La, Ta, Sc, Ce, Pr, Nd, Gd, Sm and Dy. Suitable examples are $(Me_2N)_4M$, M=Ti, Zr, Hf, or β-diketonates $M(thd)_3$, M=Y, La. Further examples are Hf tert-butoxide, Hf dimethylamide, Hf ethylmethylamide, Hf diethylamide or $Hf(MMP)_4$, $Ti(OC_2H_5)_4$ or $Ti(OCH(CH_3)_2)_4$.

Owing to their high sticking coefficient, a trialkylaluminum is preferably used as the reactive component for fabricating the starter layer. The examples of suitable trialkylaluminum compounds are triethylaluminum or trimethylaluminum. Trimethylaluminum is particularly preferred.

The method according to the invention is suitable, in principle, for the vertical patterning of different types of reliefs. In a particular manner, however, it is suitable for patterning trenches that are formed in a high aspect ratio in a substrate. It is precisely in trenches having a high aspect ratio that the deposition of the reactive component is effected in diffusion-determined fashion in a pronounced systematic manner from the substrate surface. The extent of a collar made of silicon dioxide at that end of the trench that is adjacent to the substrate surface can therefore be embodied with high precision.

In a particularly preferred embodiment of the method according to the invention, the trenches are formed functionally into capacitors. The method according to the invention enables a dielectric collar made of silicon dioxide to be produced in a simple manner, so that the steps required for fabricating a trench capacitor can be considerably reduced. The trenches that are customarily used for the fabrication of deep trench capacitors usually have an aspect ratio of more than thirty (>30), preferably more than fifty (>50). A further increase in the aspect ratio is expected for the future. An aspect ratio is understood to be the ratio of the extent of the trench into the depth of the substrate, that is to say perpendicular to the substrate surface, to the extent of the opening of the trench at the substrate surface.

In the fabrication of a collar made of silicon dioxide for a trench capacitor, by way of example, firstly a starter layer is produced from trimethylaluminum by using non-conformal deposition on a section of the process area. The starter layer is subsequently converted into aluminum oxide by reaction with the tris(tert-butoxy)silanol. The aluminum oxide layer has a high trap density, for which reason parasitic transistors may be formed in the completed trench capacitor. The parasitic transistors lead to a premature discharge of the capacitor due to a high leakage current density. Therefore, a covering layer made of silicon dioxide is preferably applied before the deposition of the starter layer at least on the process areas. The covering layer may have a thickness of 1 to 5 nm, for example. Hydroxyl groups are then available for the bonding of the reactive component, for example trimethylaluminum, on the surface of the silicon dioxide layer.

The covering layer made of silicon dioxide may be produced from $SiCl_4$ and $H_2O$ by using a CVD method, for example. However, the covering layer made of silicon dioxide is preferably produced by thermal oxidation. In this case, the entire relief, i.e. the areas that are formed from silicon, is lined with a covering layer made of silicon dioxide.

Uncovered sections of the covering layer made of silicon dioxide may be removed after the application of the patterned silicon dioxide layer. The covering layer can be removed by using a wet treatment with dilute aqueous hydrofluoric acid, for example.

Other features that are considered as characteristic for the invention are set forth in the appended claims.

Although the invention is illustrated and described herein as embodied in a method for producing vertical patterned layers made of silicon dioxide, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings in detail and first, particularly to FIG. 1 thereof, there is shown a mechanism for the growth of a silicon dioxide layer as proposed by R. Gordon et al. Disposed on a process area 1 are hydroxyl groups 2 that can react with trimethylaluminum as reactive component. In this case, two methyl groups of the trimethylaluminum are replaced by the oxygen atoms of the hydroxyl groups 2; two methane molecules are liberated per molecule of trimethylaluminum. Given an excess of trimethylaluminum, the reaction proceeds until all the hydroxyl groups 2 on the process area 1 have reacted. A monolayer of a starter layer thus forms which, with the methyl groups that are still bonded to the aluminum, has leaving groups for the hydroxyl groups of the tris(tert-butoxy)silanol. Once any excess trimethylaluminum has been removed from the process space, tris(tert-butoxy) silanol is then introduced. The hydroxyl group of the tris (tert-butoxy)silanol reacts with the aluminum atom of the starter layer, the methyl group that has remained on the aluminum in each case being displaced with cleavage of a molecule of methane. If an excess of tris(tert-butoxy)silanol is offered, further tris(tert-butoxy)silanol molecules may be intercalated into the aluminum-oxygen bond, so that a chain lengthening occurs with cleavage of tert-butanol. A repeated intercalation of tris(tert-butoxy)silanol molecules leads to the formation of siloxane chains on the process area 1. FIG. 1B schematically shows the configuration of these siloxane chains 3. The chains all have an identical extent. Since the individual tris(tert-butoxy)silanol molecules are in each case intercalated into the aluminum-oxygen bond at the process area 1, the chain growth is largely insensitive to fluctuations in the concentration of the tris(tert-butoxy)silanol over the process area 1. The tert-butyl groups bonded to a silicon atom can be cleaved thermally, with cleavage of isobutene and liberation of a hydroxyl group at the silicon. The mechanism is illustrated in FIG. 1C. The liberated hydroxyl group can then attach to a silicon atom of an adjacent siloxane chain, so that a crosslinking of the chains takes place with cleavage of tert-butanol. If hydroxyl groups are liberated in adjacent siloxane chains, the chains can likewise crosslink with cleavage of water. Possible mechanisms for the crosslinking of adjacent siloxane chains are illustrated in FIG. 1D. Finally, a layer made of silicon dioxide is obtained as a result of the increasing crosslinking. Since no more tris(tert-butoxy)silanol can diffuse through the silicon dioxide layer, the chain growth comes to a standstill. If the layer thickness is to be increased further, therefore, a monolayer is produced anew from trimethylaluminum as starter layer, and the layer thickness growth is continued, as described above, by the subsequent introduction of tris(tert-butoxy) silanol.

FIG. 2A to FIG. 2E show successive process steps in the fabrication of a collar made of silicon dioxide at the upper section of a trench introduced into a substrate. A substrate 6 including a semiconductor substrate 4 and an auxiliary layer 5 disposed on the semiconductor substrate 4 has a horizontal substrate surface 7, from which a trench 8 extends into the substrate 6 in a direction perpendicular to the substrate surface 7 as far as a relief depth 9. The trench wall 10 forms process areas 11 perpendicular to the substrate surface 7. A coverage depth 12, up to which the relief formed by the trench 8 is to be covered with a layer of silicon dioxide that is to be formed subsequently, is prescribed between the substrate surface 7 and the relief depth 9. The coverage depth 12 divides the trench 8 into an upper trench region 13 oriented toward the substrate surface 7 and a lower trench region 14. In accordance with the trench regions 13, 14, upper sections 15 of the process area 11 are disposed between the substrate surface 7 and the coverage depth 12 and lower sections 16 of the process area 11 are disposed between the coverage depth 12 and the relief depth 9.

Figure 1A:
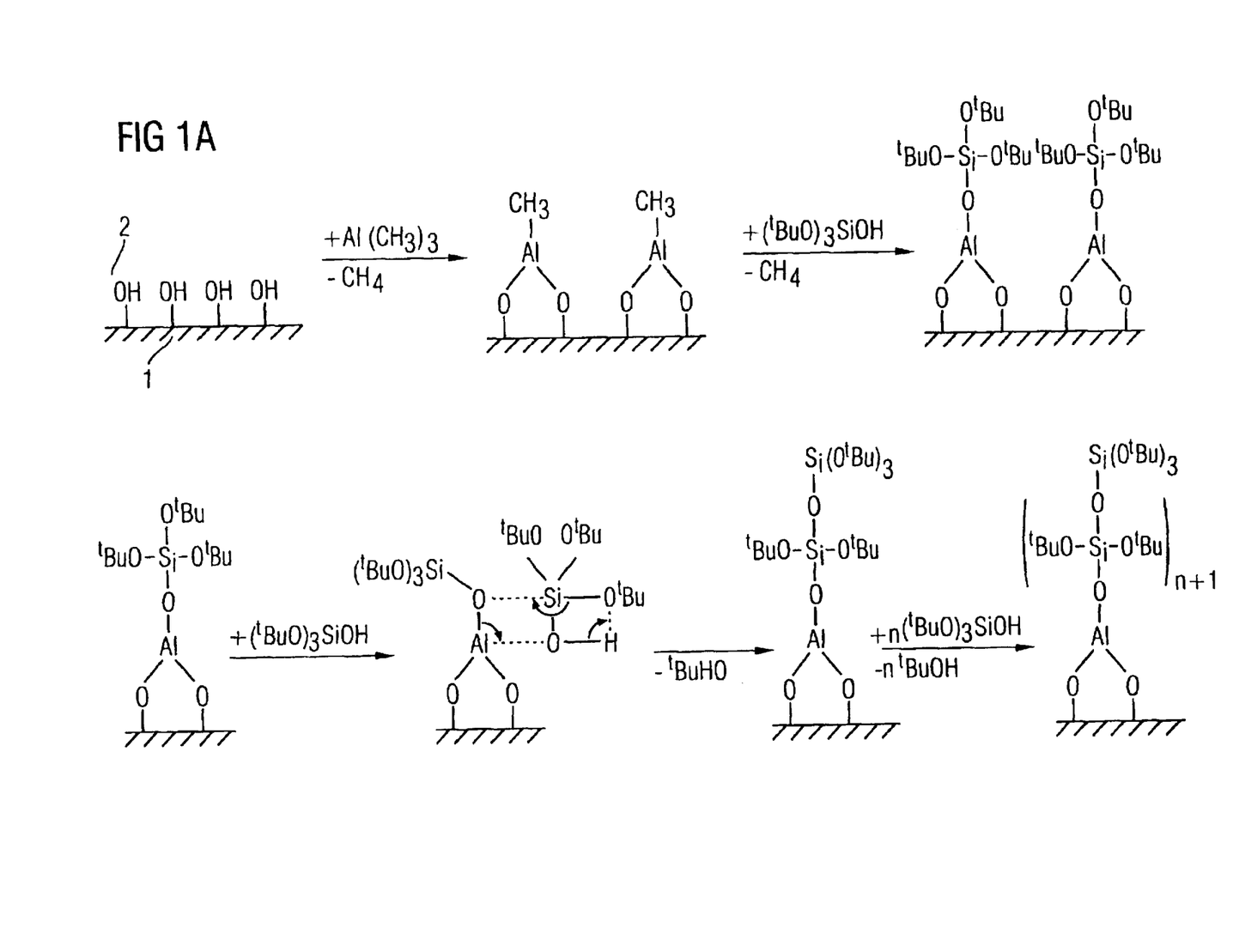
FIGS. 1A–1D are schematic illustrations showing a possible mechanism of the production of a layer made of silicon dioxide.
Figure 1B:
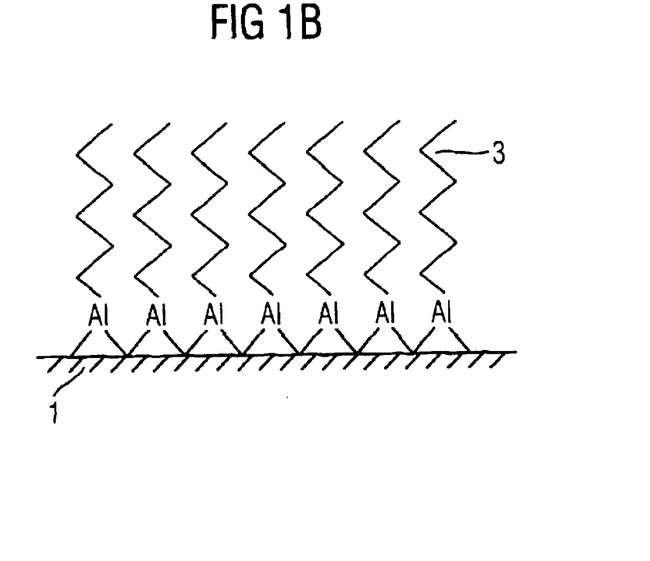
Figure 1C:
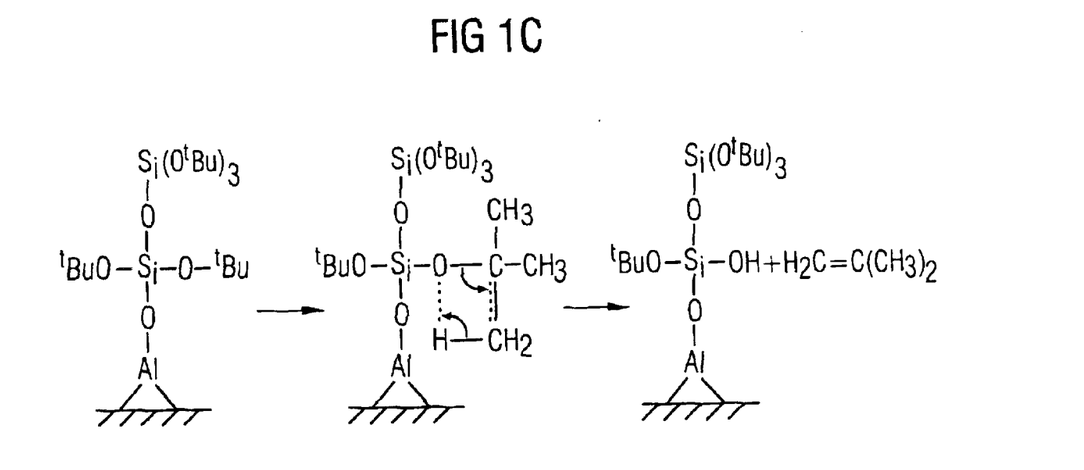
Figure 1D:
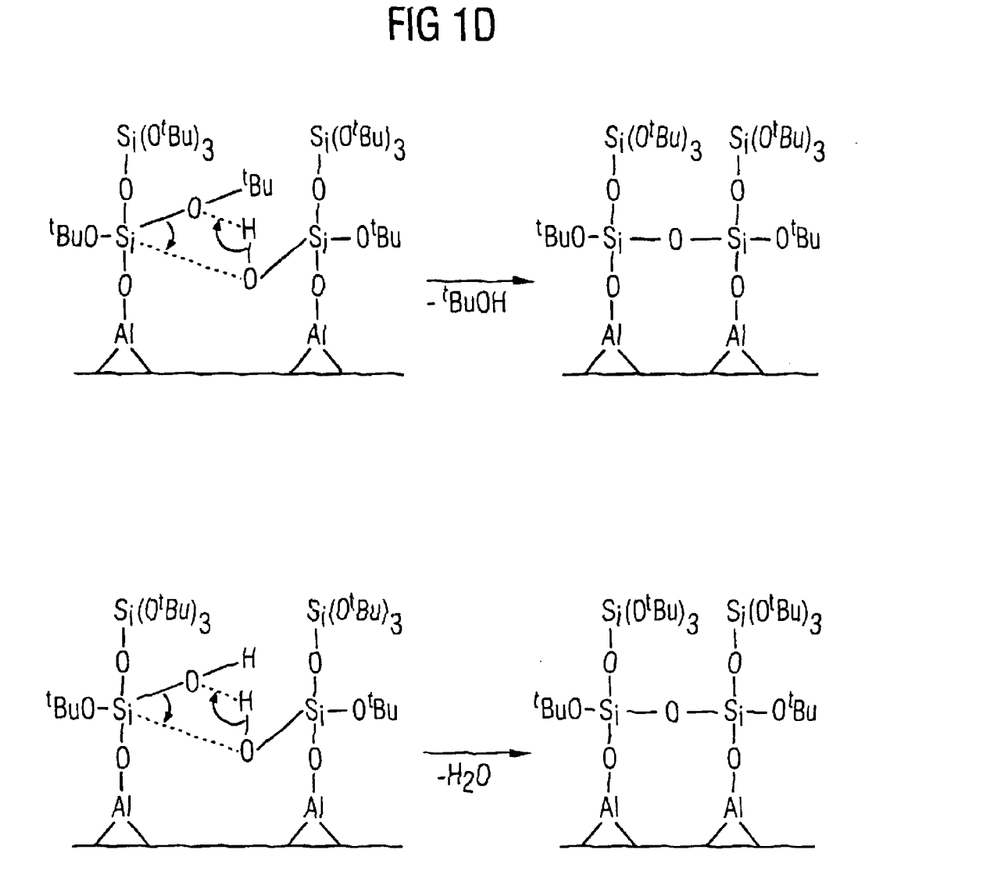
Figure 2A:
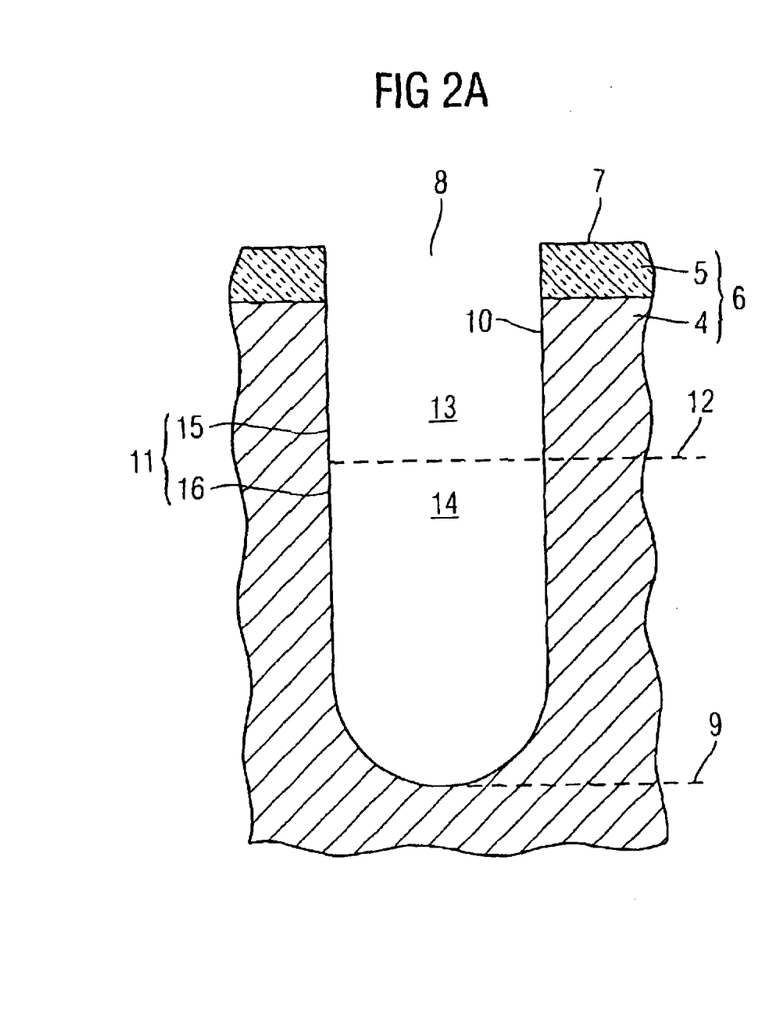
FIGS. 2A–2G show a schematic sequence of method steps that are performed in the method according to the invention.
Figure 2B:
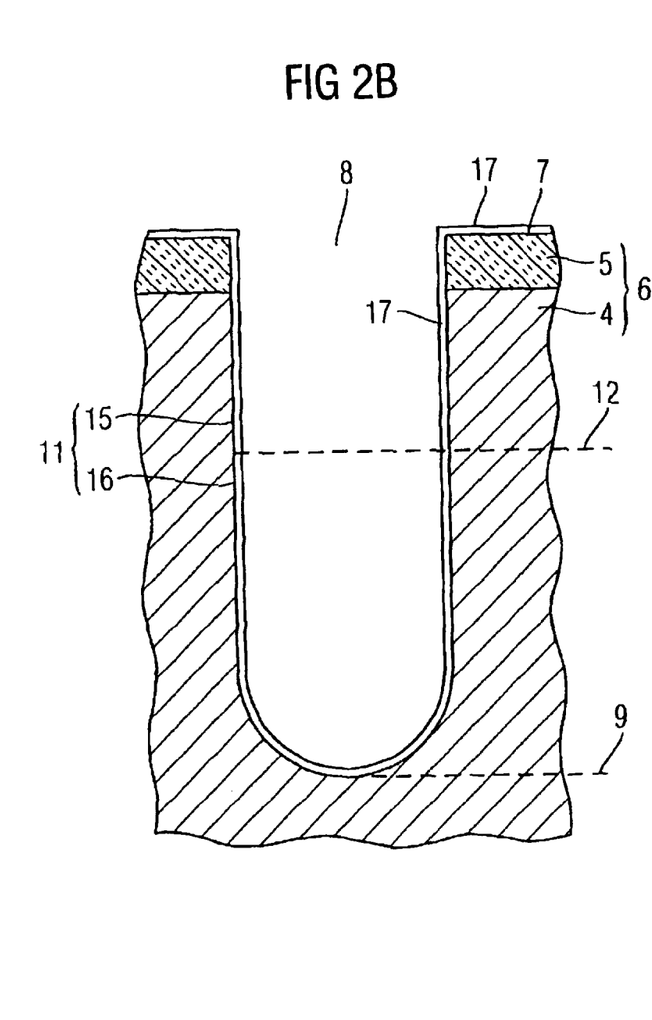

The trench 8 is firstly lined completely with a thin covering layer 17 having a thickness of approximately 2 nm. The covering layer 17 may, for example, include silicon dioxide and be produced by thermal oxidation if the substrate 6 is constructed from silicon. As an alternative, by way of example, it is also possible to employ an ALD or CVD method in order to produce the covering layer 17 made of silicon dioxide from suitable precursor compounds.

Figure 2C:
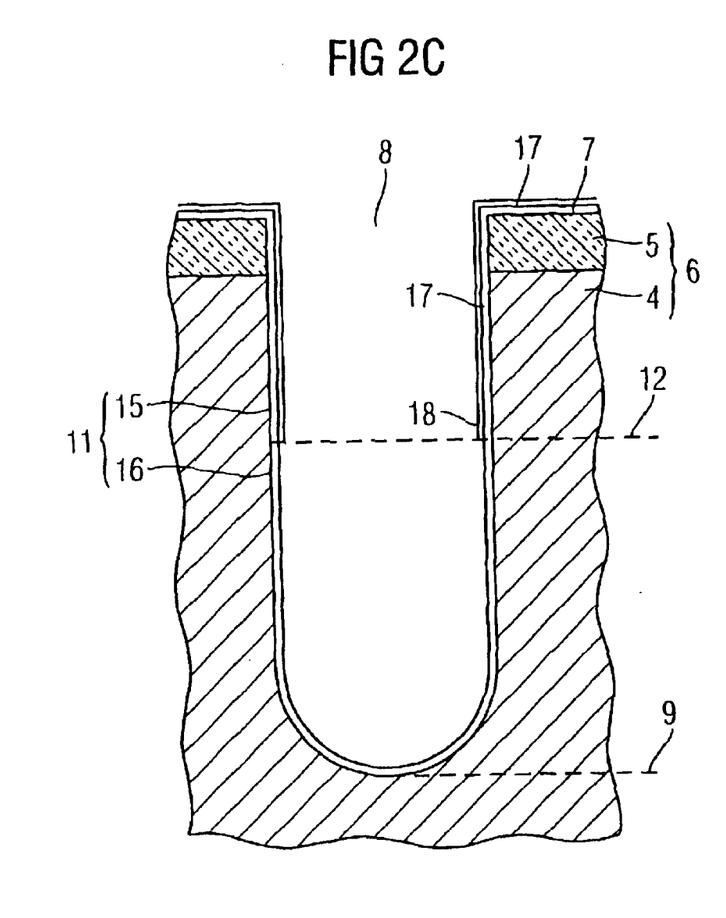

In accordance with the method according to the invention, a starter layer 18 is produced on those sections of the covering layer 17 that are disposed on the substrate surface 7 and the upper sections 15. Due to the high sticking coefficient of the reactive component, the starter layer 18 grows proceeding from the substrate surface 7 in the direction of the relief depth 9. The growth of the starter layer 18 in the direction of the relief depth 9 is restricted. By way of example, for this purpose a process quantity of the reactive component is restricted, so that the starter layer 18 grows no further than as far as the coverage depth 12. The process of depositing the starter layer 18 also can be terminated upon reaching the coverage depth 12, for example by reactive component that is still present in the process space being pumped away.

A formation of a starter layer 18 as illustrated in FIG. 2C results in both cases. The starter layer 18 extends as a uniform monolayer above the coverage depth 12. Virtually no deposition of the reactive component takes place below the coverage depth 12.

Figure 2D:
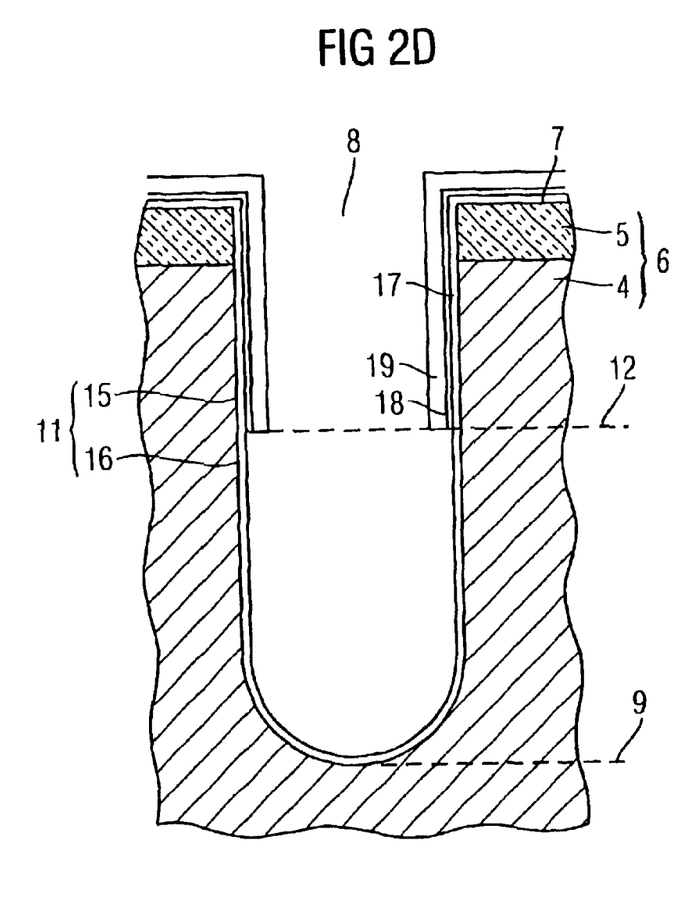

After the reactive component has been pumped away from the process space, tris(tert-butoxy)silanol is introduced into the process space. In this case, the tris(tert-butoxy) silanol is offered in a concentration at which the formation of a siloxane layer 19 does not proceed in a diffusion-controlled manner. The trench 8 is thus completely filled with gaseous tris(tert-butoxy)silanol. However, a deposition of the tris(tert-butoxy)silanol takes place only in those sections of the process area 11 that are covered by the starter layer 18. Therefore, the siloxane layer 19 is formed only in the upper section 15 of the process area, whereas no reaction takes place in the lower section 16 of the trench 8. The siloxane layer 19 thus extends uniformly and with a uniform layer thickness above the coverage depth 12. No layer thickness growth takes place below the coverage depth 12.

Figure 2E:
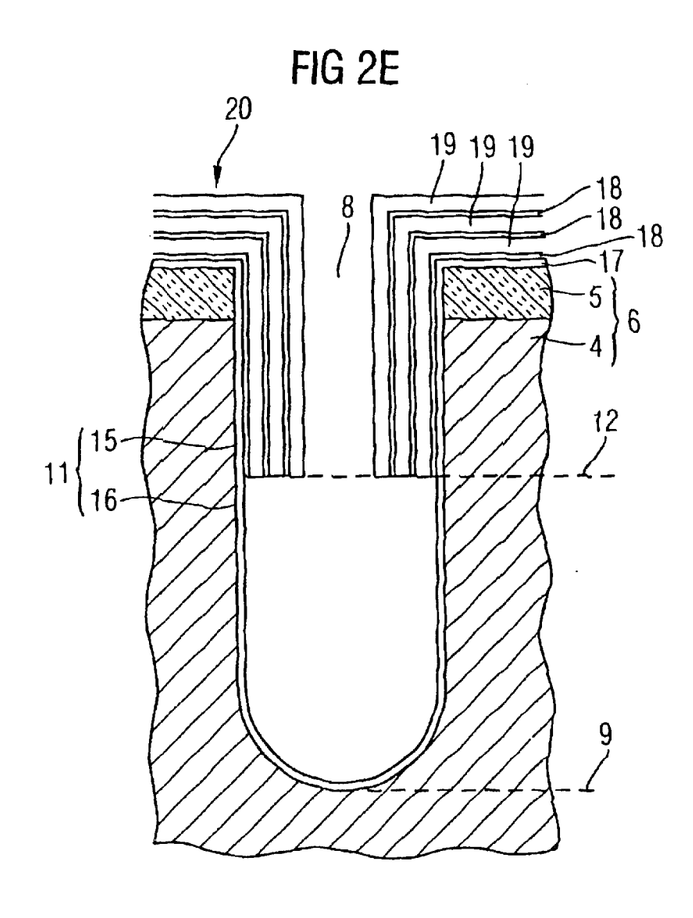
Figure 2F:
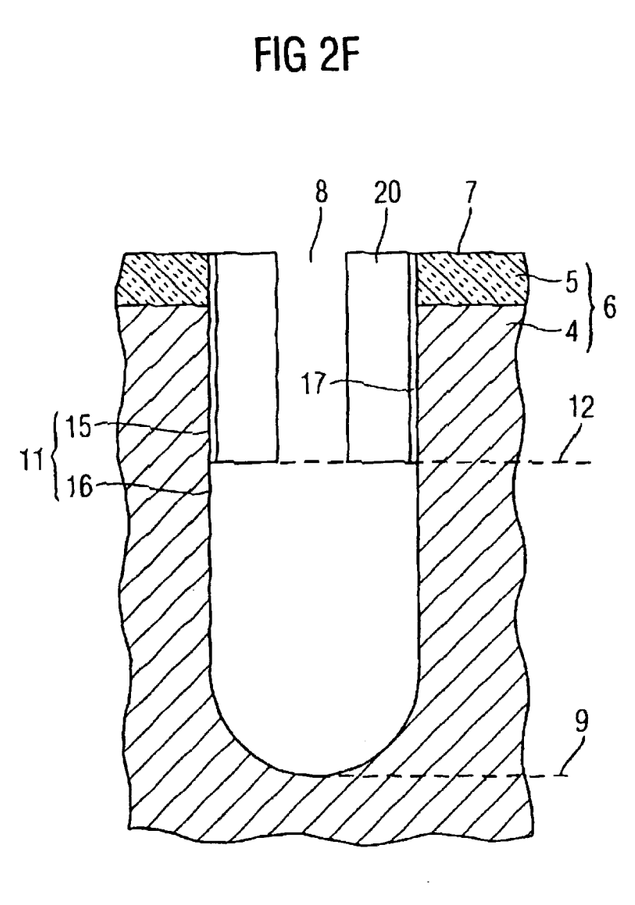
Figure 2G:
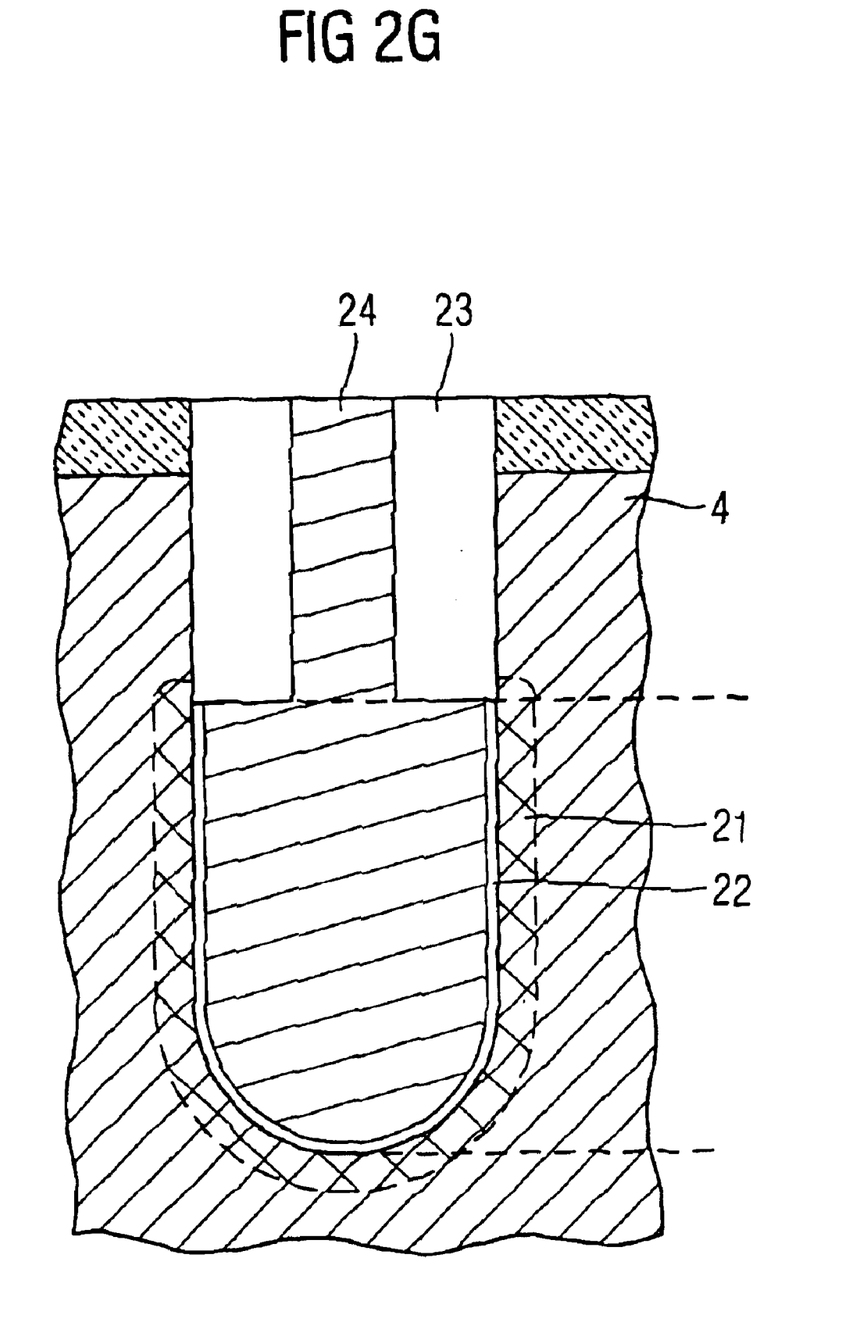

The formation of a starter layer 18 in a first process step and afterward the formation of a siloxane layer 19 in a second process step is repeated a number of times, so that the thickness of the silicon dioxide layer formed in the upper section 15 increases to the desired extent. The state illustrated in FIG. 2E is obtained. A silicon dioxide layer 20 has been produced in the upper section 15 of the trench 8 by repeated deposition of a starter layer 18 and of a siloxane layer 19. After the crosslinking of the siloxane layers 19, the layer 20 is substantially formed from silicon dioxide, with which are admixed small quantities of aluminum, for example, which have resulted from the starter layer 18. The silicon dioxide layer 20 typically contains proportions of aluminum ions in the region of approximately 1%. Afterward, the covering layer 17 is removed in the lower section 16 of the trench 8 by etching using dilute hydrofluoric acid and the layer 20 is removed on the substrate surface 7 by anisotropic etching. The construction illustrated in FIG. 2F is obtained. A collar formed from the silicon dioxide layer 20 is disposed in the upper section 15 of the process area 11 or of the trench 8. The collar extends with uniform layer thickness from the substrate surface 7 as far as a coverage depth 12. The silicon dioxide layer 20, which is doped with aluminum ions, for example, is separated from the substrate 6 by a covering layer 17 made of silicon dioxide. The wall of the trench 8 is uncovered again in the lower section 16 of the process area 11 in the region of the trench 8 between the coverage depth 12 and the relief depth 9. From the construction illustrated in FIG. 2F, a capacitor can then be constructed in a customary manner in further sections, for example by the semiconductor substrate 4 being selectively doped by vapor phase doping in the lower sections 16. In the application in the fabrication of DT (Deep Trench) DRAM memory cells, the doped region thus produced corresponds to a low-impedance connection of an outer electrode (buried plate). After a dielectric has been deposited in the lower sections 16, the remaining inner space of the trench 8 can be filled with highly doped polysilicon, for example, in order to obtain a counterelectrode. The schematic construction of such a trench capacitor is illustrated in FIG. 2G. Vapor phase doping has resulted in doped regions 21 in the semiconductor substrate 4, which form the outer electrode of the capacitor. Disposed on the doped regions 21 is a layer 22 of a dielectric that extends below the collar 23 along the wall. The remaining space is filled with highly doped polysilicon in order to obtain a counterelectrode 24. The counterelectrode 24 can be connected to a transistor (not illustrated) in subsequent work steps in order to control the charge state of the trench capacitor.

We claim:

1. A method for fabricating patterned silicon dioxide layers on process areas disposed perpendicularly or obliquely to a substrate surface, which comprises:

providing a substrate in a process space, the substrate having a substrate surface and including a relief with process areas disposed perpendicularly or obliquely to the substrate surface;

in a first step, producing a starter layer with leaving groups substitutable by hydroxyl groups on sections of the process areas extending from the substrate surface to a given coverage depth of the relief, the producing of the starter layer including restricting a quantity of a reactive component forming the starter layer in the process space to less than a quantity required for completely covering the process area; and in a second step, adding tris(tert-butoxy)silanol to the substrate to grow selectively a layer of silicon dioxide on the starter layer.

2. The method according to claim 1, which further comprises successively repeating the first and second steps a plurality of times.

3. The method according to claim 1, wherein the producing of the starter layer includes chemisorption of a reactive component and restricting a quantity of a reactive component forming the starter layer in the process space to less than a quantity required for completely covering the process areas.

4. The method according to claim 3, wherein the restricting of the quantity of the reactive component includes restricting the quantity of the reactive component fed to the process space.

5. The method according to claim 4, which further comprises metering, by liquid injection, the quantity of the reactive component fed to the process space.

6. The method according to claim 3, wherein the restricting of the quantity of the reactive component includes controlling a residence duration of the reactive component in the process space.

7. The method according to claim 3, wherein the restricting of the quantity of the reactive component includes controlling a chamber pressure prevailing in the reaction space.

8. The method according to claim 3, which further comprises adding the reactive component by uniformly distributing the reactive component over the substrate surface with a distribution device provided in the process space.

9. The method according to claim 3, which further comprises using an organometallic compound as the reactive component.

10. The method according to claim 9, which further comprises selecting a metal in the organometallic compound from the group consisting of Al, Hf, Zr, Ti, Y, La, Ta, Sc, Ce, Pr, Nd, Gd, Sm, and Dy.

11. The method according to claim 3, which further conspires using trialkylaluminum as the reactive component.

12. The method according to claim 11, which further comprises using trimethylaluminum as the trialkylaluminum.

13. The method according to claim 1, which further comprises forming trenches having a high aspect ratio as the relief in the substrate.

14. The method according to claim 13, which further comprises forming the trenches functionally into capacitors.

15. The method according to claim 1, which further comprises applying a covering layer made of silicon dioxide before the producing of the starter layer.

16. The method according to claim 15, which further comprises:

constructing the substrate from silicon; and producing the covering layer made of silicon dioxide by thermal oxidation.

17. The method according to claim 15, which further comprises removing uncovered sections of the covering layer made of silicon dioxide after the applying of the silicon dioxide layer.

18. A method for fabricating patterned silicon dioxide layer on process areas disposed perpendicularly or obliquely to a substrate surface, which comprises:

providing a substrate in a process space, the substrate having a substrate surface and including a relief with process areas disposed perpendicularly or obliquely to the substrate surface;

in a first step, applying a covering layer made of silicon dioxide on the substrate, constructing the substrate from silicon and producing the covering layer made of silicon dioxide by thermal oxidation;

in a second step, producing a starter layer with leaving groups substitutable by hydroxyl groups on sections of the process areas extending from the surface of the covering layer to a given coverage depth of the relief, the producing of the starter layer including restricting a quantity of a reactive component forming the starter layer in the process space to less than a quantity required for completely covering the process area; and in a third step, adding tris(tert-butoxy)silanol to the substrate to grow selectively a layer of silicon dioxide on the starter layer.

19. A method for fabricating patterned silicon dioxide layers on process areas disposed perpendicularly or obliquely to a substrate surface, which comprises:

providing a substrate in a process space, the substrate having a substrate surface and including a relief with process areas disposed perpendicularly or obliquely to the substrate surface;

in a first step, applying a covering layer made of silicon dioxide on the substrate;

in a second step, producing a starter layer with leaving groups substitutable by hydroxyl groups on sections of the process areas extending from the surface of the covering layer to a given coverage depth of the relief, the producing of the starter layer including restricting a quantity of a reactive component forming the starter layer in the process space to less than a quantity required for completely covering the process area; and in a third step, adding tris(tert-butoxy)silanol to the substrate to grow selectively a layer of silicon dioxide on the starter layer, and removing uncovered sections of the covering layer made of silicon dioxide after the applying of the silicon dioxide layer.

20. The method according to claim 19, which further comprises patterning the layer made of silicon dioxide.

21. The method according to claim 19, which further comprises removing the uncovered sections of the covering layer made of silicon dioxide by using dilute hydrofluoric acid.

* * * * *